(12) United States Patent
Tan

(10) Patent No.: US 11,265,034 B1
(45) Date of Patent: Mar. 1, 2022

(54) SIGNAL MIXING CIRCUIT DEVICE AND RECEIVER

(71) Applicant: Hangzhou Geo-chip Technology Co., Ltd., Hangzhou (CN)

(72) Inventor: Chun Geik Tan, San Diego, CA (US)

(73) Assignee: HANGZHOU GEO-CHIP TECHNOLOGY CO., LTD., Hangzhou (CN)

(*) Notice: Subject to any disclaimer, the term of this patent is extended or adjusted under 35 U.S.C. 154(b) by 48 days.

(21) Appl. No.: 16/947,589

(22) Filed: Aug. 7, 2020

(51) Int. Cl.
| | |
|---|---|
| *H04B 1/30* | (2006.01) |
| *H03D 7/16* | (2006.01) |
| *H04B 1/16* | (2006.01) |
| *H03D 7/14* | (2006.01) |

(52) U.S. Cl.
CPC ............ *H04B 1/30* (2013.01); *H03D 7/1458* (2013.01); *H03D 7/165* (2013.01); *H04B 1/1607* (2013.01); *H04B 2001/307* (2013.01)

(58) Field of Classification Search
CPC .. H04B 1/30; H04B 1/1607; H04B 2001/307; H03D 7/1458; H03D 7/165
See application file for complete search history.

(56) References Cited

U.S. PATENT DOCUMENTS

| | | | | |
|---|---|---|---|---|
| 5,678,222 | A | * 10/1997 | Hornak | ............... H03D 7/00 327/113 |
| 2009/0147884 | A1 | * 6/2009 | Sridharan | ............ H04B 1/0007 375/316 |

* cited by examiner

*Primary Examiner* — Nader Bolourchi
(74) *Attorney, Agent, or Firm* — Fay Kaplun & Marcin, LLP

(57) ABSTRACT

A signal mixing circuit device includes a first mixer, a second mixer and a signal amplifying circuit serially connected to the first mixer; the first mixer includes an RF signal input terminal for receiving an RF signal, LO signal input terminals for sampling a first and second LO signals, a first mixed-signal output terminal for outputting a first mixed signal and a second mixed-signal output terminal for outputting a second mixed signal; the second mixer includes an input terminal connected to a capacitor, two mixed-signal output terminals respectively connected to the first and second mixed-signal output terminals of the first mixer, LO signal input terminals for inversely sampling the first and second LO signals. With the double-balance nature of the second mixer core, the noise at the LO signal input terminals of the first mixer can be cancelled. A receiver includes the signal mixing circuit device is also disclosed.

11 Claims, 6 Drawing Sheets

SIGNAL MIXING CIRCUIT DEVICE AND RECEIVER

TECHNICAL FIELD

The present disclosure relates to the field of telecommunication technology, and particularly to a signal mixing circuit device and a receiver.

BACKGROUND

The traditional receiver receives a Radio Frequency (RF) signal via its antenna, and the RF signal may sequentially pass through a band-pass or low-pass filter, a Matching Network (MN), a Low-Noise Amplifier (LNA), a mixer, an analog baseband filter, an Analog-to-Digital Converter (ADC) and a digital demodulator on a Printed Circuit Board (PCB), thereby obtaining the required signal. Presently, a single-ended receiver may convert a single-ended RF signal into a differential Intermediate Frequency (IF) signal in two manners of: (1) converting directly the single-ended RF signal into the differential IF signal by a traditional single balance mixer, which is however very sensitive to the noise at its Local Oscillator (LO) signal input terminal (i.e. LO part) and thus tends to cause a high noise figure; and (2) converting the single-ended RF signal into a differential RF signal by an on-chip or off-chip BALUN and sampling the differential RF signal by a double balance mixer to obtain the differential IF signal. However, the BALUN following the antenna causes an increased area, a high cost and high power consumption of the chip.

SUMMARY

The present disclosure provides a signal mixing circuit device and a receiver, to address one or more of the problems existing in the prior art.

In an aspect, an embodiment provides a signal mixing circuit device, which includes a first mixer, a second mixer, and a signal amplifying circuit connected in serial with the first mixer.

The first mixer includes an RF signal input terminal configured to receive an RF signal, LO signal input terminals configured to sample a first LO signal and a second LO signal, a first mixed-signal output terminal configured to output a first mixed signal, and a second mixed-signal output terminal configured to output a second mixed signal, and the first and second mixed-signal output terminals are connected to the signal amplifying circuit.

The second mixer includes an input terminal connected to a capacitor, a first mixed-signal output terminal which is connected to the first mixed-signal output terminal of the first mixer, a second mixed-signal output terminal which is connected to the second mixed-signal output terminal of the first mixer, and LO signal input terminals configured to inversely sample the first LO signal and the second LO signal, that is, the first and second LO signals sampled by the first mixer are respectively of an inverse phase with respect to the first and second LO signals sampled by the second mixer.

In an embodiment, the signal amplifying circuit includes a first stage of amplifier and two first resistors, where the first stage of amplifier includes a first input terminal which is connected to the first mixed-signal output terminal of the first mixer and configured to receive the first mixed signal, a second input terminal which is connected to the second mixed-signal output terminal of the first mixer and configured to receive the second mixed signal, a first output terminal and a second output terminal, one of the two first resistors is connected in parallel between the first input terminal and the first output terminal of the first stage of amplifier, and the other of the two first resistors is connected in parallel between the second input terminal and the second output terminal of the first stage of amplifier.

In an embodiment, the signal amplifying circuit further includes a second stage of amplifier and two second resistors, where the second stage of amplifier includes a first input terminal which is connected to the first output terminal of the first stage of amplifier at a first joint, a second input terminal which is connected to the second output terminal of the first stage of amplifier at a second joint, a first output terminal and a second output terminal, where the one of the two first resistors is connected in parallel between the first input terminal of the first stage of amplifier and the first output terminal of the second stage of amplifier, and the other of the two first resistors is connected in parallel between the second input terminal of the first stage of amplifier and the second output terminal of the second stage of amplifier; one of the two second resistors is connected in parallel between the first joint and the first output terminal of the second stage of amplifier, and the other of the two second resistors is connected in parallel between the second joint and the second output terminal of the second stage of amplifier.

In an embodiment, the first mixer includes a first transistor switch and a second transistor switch, where the first transistor switch includes a gate configured for receiving the first LO signal, a drain configured for outputting the first mixed signal, and a source; the second transistor switch includes a gate configured for receiving the second LO signal, a drain configured for outputting the second mixed signal, and a source; the sources of the first transistor switch and the second transistor switch are configured for receiving the RF signal.

In an embodiment, the second mixer includes a third transistor switch and a fourth transistor switch, where the third transistor switch includes a gate configured for receiving the second LO signal, a source configured for receiving the first mixed signal, and a drain; and the source of the third transistor switch is connected to the drain of the first transistor switch, the fourth transistor switch includes a gate configured for receiving the first LO signal, a source configured for receiving the second mixed signal, and a drain; and the source of the fourth transistor switch is connected to the drain of the second transistor switch, the drains of the third transistor switch and the fourth transistor switch are grounded.

In an embodiment, the first LO signal has a phase of 0°, and the second LO signal has a phase of 180°; or the first LO signal has a phase of 90°, and the second LO signal has a phase of 270°, so that the phase of the first LO signal is different from that of the second LO signal by 180°.

In an embodiment, the first stage of amplifier and/or the second stage of amplifier include a single-stage Complementary Metal Oxide Semiconductor circuit unit.

Alternatively, the first stage of amplifier and/or the second stage of amplifier include a multi-stage Complementary Metal Oxide Semiconductor circuit unit In a further aspect, a receiver is disclosed and includes at least one signal mixing circuit device as described above.

The above technical solutions are advantageous in that: with the use of the second mixer which is connected to the output terminals of the first mixer and samples the first and second LO signals in a manner inverted to the manner used by the first mixer to sample the first and second LO signals, noise at the LO signal input terminals of the first mixer can be cancelled due to the double-balance nature of the second mixer core, and the area, costs and power consumption of the circuit can be significantly reduced because no off-chip BALUN is required compared with the prior art.

The above description is provided for the purpose of better understanding of the present disclosure, but is not intended to limit the present invention in any way. In addition to the illustrative aspects, embodiments and features as described herein with reference to the drawings, additional aspects, embodiments and features would become apparent to those skilled in the art.

BRIEF DESCRIPTION OF THE DRAWINGS

Unless otherwise specified, the similar reference numerals represent the same or similar parts or elements throughout the drawings. These drawings are not necessarily made in proportion. It should be appreciated that these drawings merely illustrate some embodiments of the present invention and are not intended to limit the scope of the present invention.

Figure 1:
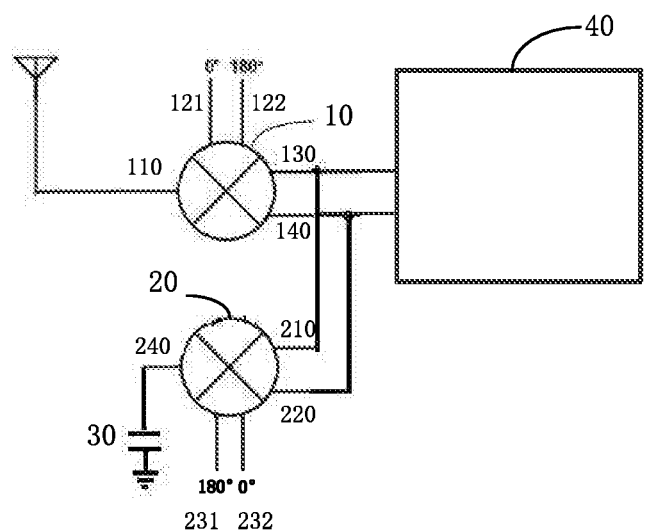
FIG. 1 is a schematic structural diagram of a signal mixing circuit device according to an embodiment of the present invention.
Figure 2:
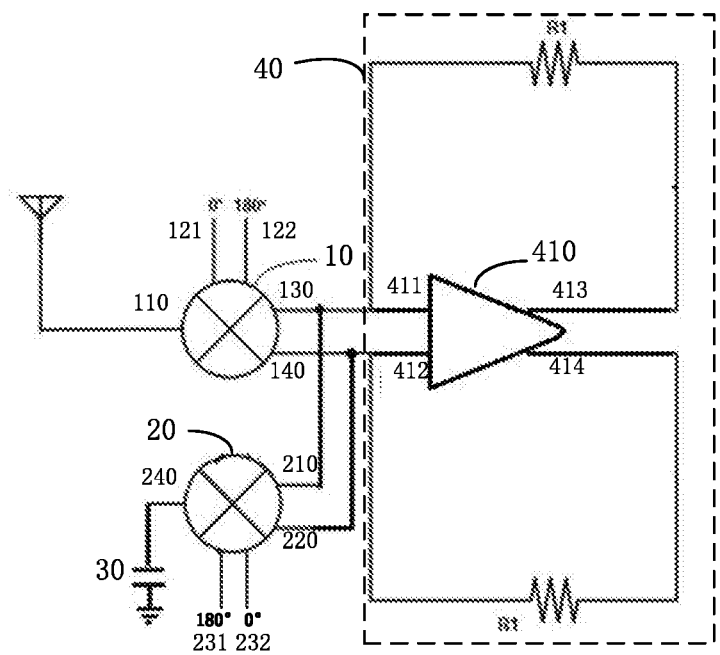
FIG. 2 is a schematic structural diagram of a signal mixing circuit device according to another embodiment of the present invention.
Figure 3:
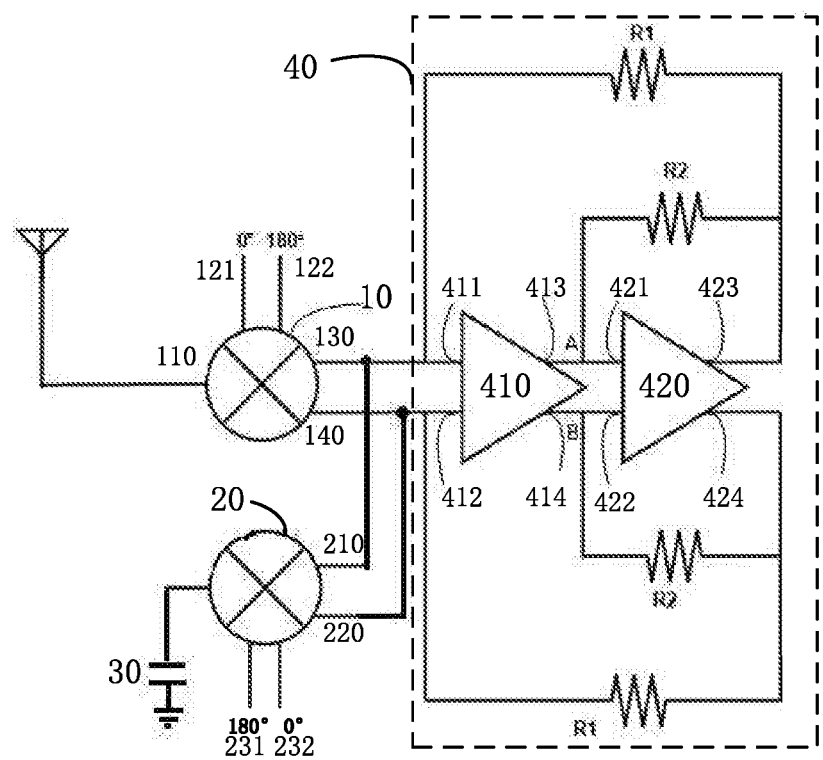
FIG. 3 is a schematic structural diagram of a signal mixing circuit device according to still another embodiment of the present invention.
Figure 4:
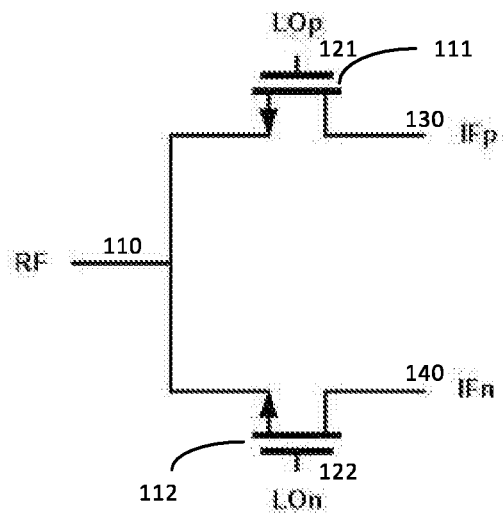
FIG. 4 is a schematic structural diagram of a first mixer according to an embodiment of the present invention.
Figure 5:
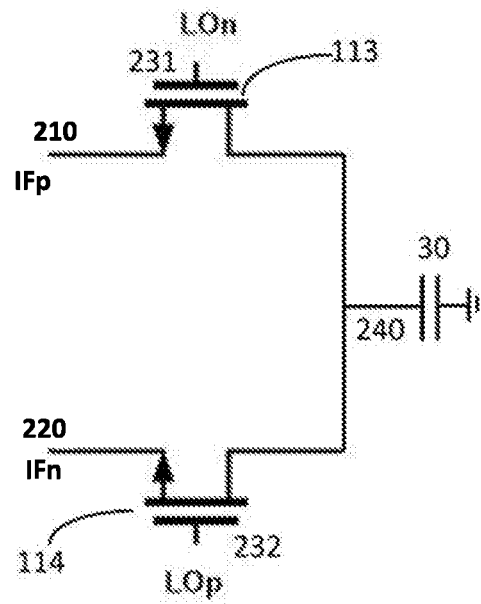
FIG. 5 is a schematic structural diagram of a second mixer according to an embodiment of the present invention.
Figure 6:
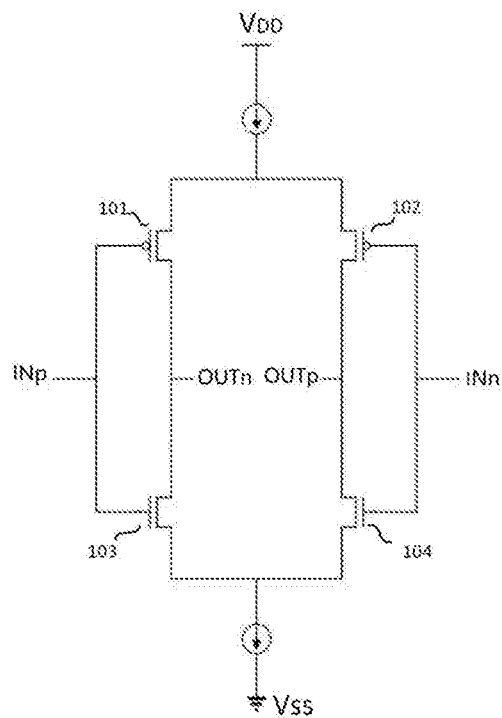
FIG. 6 is a schematic structural diagram of a first or second stage of amplifier according to an embodiment of the present invention.
Figure 7:
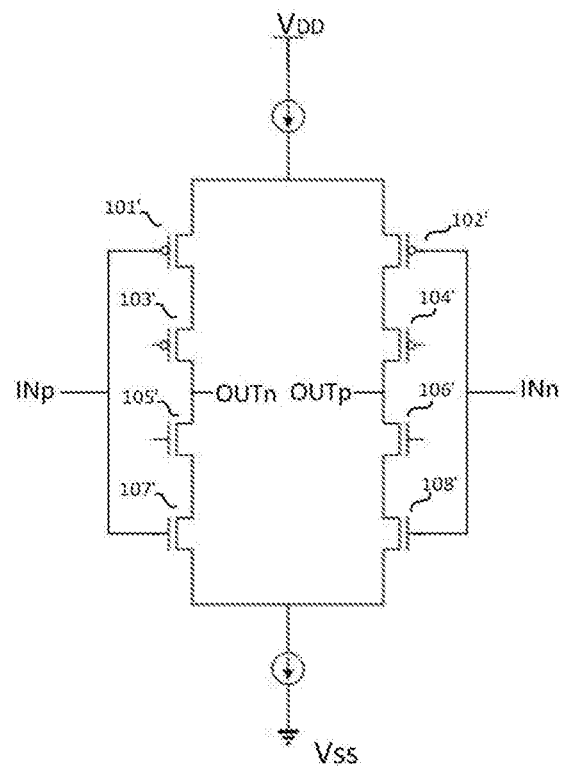
FIG. 7 is a schematic structural diagram of a first or second stage of amplifier according to another embodiment of the present invention.
Figure 8:
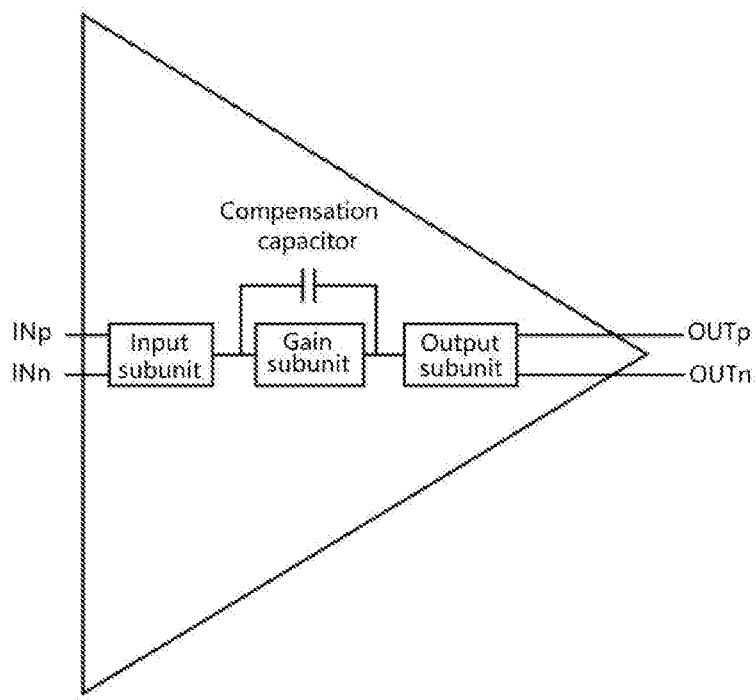
FIG. 8 is a schematic structural diagram of a first or second stage of amplifier according to still another embodiment of the present invention.
Figure 9:
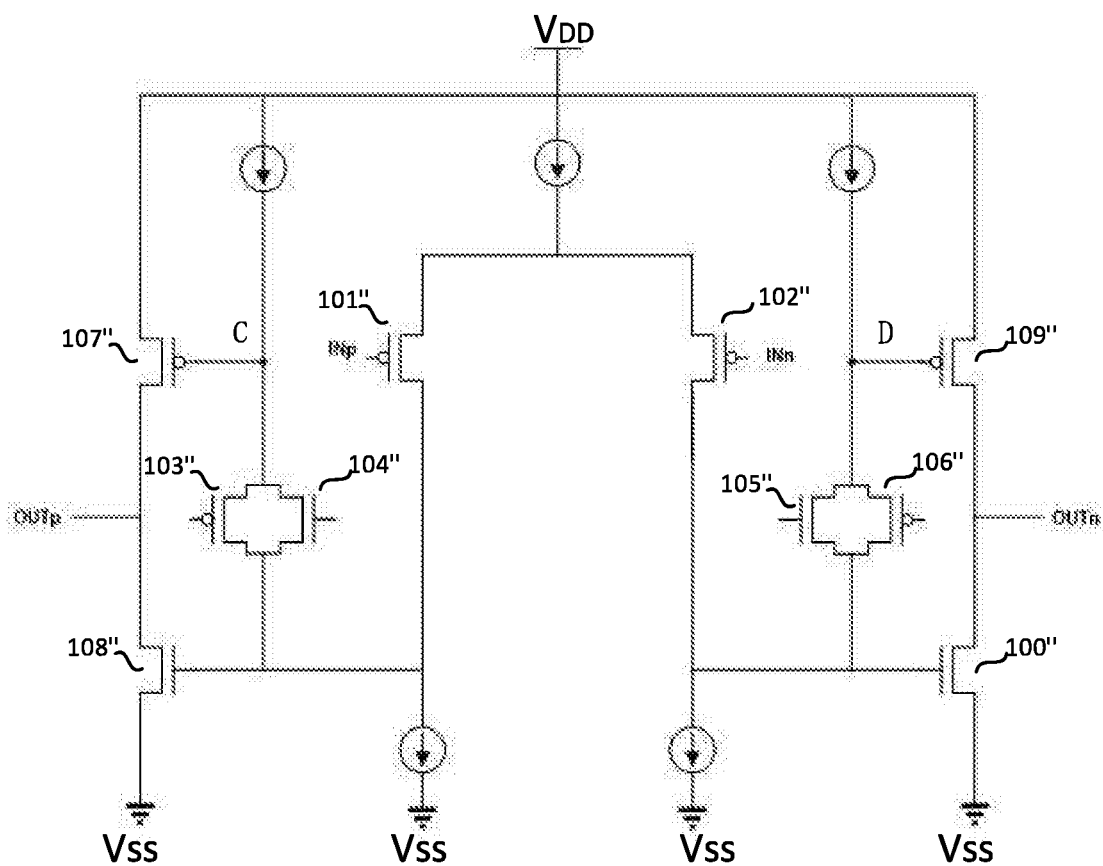
FIG. 9 is a schematic structural diagram of a first or second stage of amplifier according to still another embodiment of the present invention.

| List of reference numerals | | | | | | | |
|---|---|---|---|---|---|---|---|
| In FIG. 1: | | | | | | | |
| 10 | First mixer; | 110 | RF signal input terminal | | | | |
| 121 | First LO signal input terminal | 122 | Second LO signal input terminal | | | | |
| 130 | First mixed-signal output terminal | 140 | Second mixed-signal output terminal | | | | |
| 20 | Second mixer | 210 | First mixed-signal output terminal | | | | |
| 220 | Second mixed-signal output terminal | 231 | First LO signal input terminal | | | | |
| 232 | Second LO signal input terminal | 240 | Input terminal connected to a capacitor | | | | |
| 30 | Capacitor | 40 | Signal amplifying circuit | | | | |
| In FIG. 2: | | | | | | | |
| 410 | First stage of amplifier | 411 | First input terminal | 412 | Second input terminal | | |
| 413 | First output terminal | 414 | Second output terminal | R1 | First resistor | | |
| In FIG. 3: | | | | | | | |
| 420 | Second stage of amplifier | 421 | First input terminal | 422 | Second input terminal | | |
| 423 | First output terminal | 424 | Second output terminal | A | First joint | | |
| B | Second joint | R2 | Second resistor | | | | |
| In FIG. 4: | | | | | | | |
| 111 | First transistor switch | 112 | Second transistor switch | | | | |
| In FIG. 5: | | | | | | | |
| 113 | First transistor switch | 114 | Second transistor switch | | | | |
| In FIG. 6: | | | | | | | |
| 101 | First transistor | 102 | Second transistor | 103 | Third transistor | 104 | Fourth transistor |
| In FIG. 7: | | | | | | | |
| 101' | First transistor | 102' | Second transistor | 103' | Third transistor | 104' | Fourth transistor |
| 105' | Fifth transistor | 106' | Sixth transistor | 107' | Seventh transistor | 108' | Eighth transistor |
| In FIG. 8: | | | | | | | |
| 101" | First transistor | 102" | Second transistor | 103" | Third transistor | 104" | Fourth transistor |
| 105" | Fifth transistor | 106" | Sixth transistor | 107" | Seventh transistor | 108" | Eighth transistor |
| 109" | Ninth transistor | 100"' | Tenth transistor | | | | |
| C | Third joint | D | Fourth joint | | | | |
| In FIG. 9: | | | | | | | |
| 1 | First signal mixing circuit device | 2 | Second signal mixing circuit device | | | | |

DETAILED DESCRIPTION

In the following description, only some exemplary embodiments are described. As will be appreciated by those skilled in the art, the described embodiments may be modified in various ways without departing from the spirit or scope of the present application. Therefore, the drawings and descriptions are essentially illustrative rather than restrictive.

In the description of the present application, it should be understood that terms such as center, longitudinal, transverse, length, width, thickness, upper, lower, front, rear, left, right, vertical, horizontal, top, bottom, inner, outer, clockwise, counterclockwise, axial, radial, and circumferential indicate an orientation or positional relationship that is based on the orientation or positional relationship shown in the drawings for the sake of the convenient and simplified description of the present application, but do not indicate or imply that the involved device or element necessarily has or operates in the specified orientation, and thus should not be understood as a limitation of the present application.

In addition, the terms "first" and "second" are used for differentiating technical features, but are not intended to indicate or imply the importance of these technical features or implicitly show the number of these technical features. Thus, technical features defined by the terms "first" and "second" may explicitly or implicitly include one or more of the technical features. In the description of the present application, the expression of "a plurality of" means two or more, unless otherwise specifically defined.

In the present application, unless otherwise specified and defined explicitly, the terms "arranged", "coupled", "connected", "fixed" and the like should be understood in a broad sense, and may refer to, for example, a fixed or detachable connection or being integrated, a mechanical, electrical or communication connection, a direct connection or an indirect connection through an intermediate medium, or a connection between two elements or the interaction between two elements. The specific meanings of the above terms in the present application may be understood by those skilled in the art depending on the specific context.

In the present application, unless otherwise specified and defined explicitly, a first feature being "above" or "below" a second feature includes that the first feature is in direct contact with the second feature, or that the first and second features are in contact with each other indirectly via an additional feature therebetween. Moreover, the first feature being "above", "over" or "on" the second feature may include that the first feature is right above or inclinedly above the second feature, or simply that the first feature is higher in level than the second feature. Likewise, the first feature being "below" or "under" the second feature may include that the first feature is right below or inclinedly below the second feature, or simply that the first feature is lower in level than the second feature.

The following disclosure provides various embodiments or examples for illustrating the implementation of various structures of the present disclosure. In order to simplify the disclosure of the present application, components and arrangements of specific examples are described below. Of course, these examples are merely illustrative, but not intended to limit the present invention. In addition, the same reference numerals may be used throughout different examples for the sake of simplification and clarity, but do not necessarily mean any relationship between the various embodiments or examples.

In a specific embodiment, as shown in FIG. 1, a signal mixing circuit device includes a first mixer 10, a second mixer 20, and a signal amplifying circuit 40 connected in serial with the first mixer 10.

The first mixer 10 includes an RF signal input terminal 110 configured to receive an RF signal, LO signal input terminals configured to sample a first LO signal and a second LO signal, a first mixed-signal output terminal 130 configured to output a first mixed signal, and a second mixed-signal output terminal 140 configured to output a second mixed signal. The first mixed-signal output terminal 130 and the second mixed-signal output terminal 140 are connected to the signal amplifying circuit 40.

The second mixer 20 includes an input terminal 240 connected to a capacitor 30, a first mixed-signal output terminal 210 which is connected to the first mixed-signal output terminal 130 of the first mixer 10, a second mixed-signal output terminal 220 which is connected to the second mixed-signal output terminal 140 of the first mixer 10, and LO signal input terminals configured to inversely sample the first LO signal and the second LO signal.

In an example, an antenna for receiving RF signals is connected to the first mixer 10. The first mixer 10 includes an RF signal input terminal 110 for receiving the RF signal, LO signal input terminals, the first mixed-signal output terminal 130 and the second mixed-signal output terminal 140. The LO signal input terminals include a first LO signal input terminal 121 configured to receive the first LO signal and a second LO signal input terminal 122 configured to receive the second LO signal. The second mixer 20 includes the first mixed-signal output terminal 210, the second mixed-signal output terminal 220, LO signal input terminals, and the input terminal 240 connected to the capacitor 30. The LO signal input terminals of the second mixer 20 include a first LO signal input terminal 231 configured to receive the second LO signal and a second LO signal input terminal 232 configured to receive the first LO signal.

The mixer herein can be embodied by a circuit which outputs at least one mixed signal with a frequency equal to the sum, difference or any other combination of the frequencies of two input signals. The first mixer 10 provides the first mixed signal and the second mixed signal to both the second mixer 20 and the signal amplifying circuit 40. Because the second mixer 20 employs a manner of sampling the LO signals that is inverse to the manner of sampling the LO signals employed by the first mixer 10 and the mixed-signal input terminal 240 of the second mixer 20 is connected to the capacitor, that is, the LO signals sampled by the first mixer 10 are respectively of an inverse phase with respect to the LO signals sampled by the second mixer 20, the port noise at the LO signal input terminals of the first mixer 10 can be reduced by the second mixer 20. The capacitor 30 is further beneficial in cancelling the impendence of the antenna.

In the signal mixing circuit device provided in the embodiment of the present invention, the second mixer is additionally connected to the mixed-signal output terminals of the first mixer and employs a manner of sampling the LO signals that is inverse to the manner of sampling the LO signals employed by the first mixer, the noise at the LO signal input terminals of the first mixer is cancelled by the double-balance nature of the second mixer core, and the area, costs and power consumption of the circuit can be significantly reduced because of the cancellation of the BALUN.

In an embodiment, as shown in FIG. 2, the signal amplifying circuit 40 includes a first stage of amplifier 410 and two first resistors R1.

The first stage of amplifier 410 includes a first input terminal 411 which is connected to the first mixed-signal output terminal 130 of the first mixer 10 and configured to receive the first mixed signal, a second input terminal 412 which is connected to the second mixed-signal output terminal 140 of the first mixer 10 and configured to receive the second mixed signal, a first output terminal 413 and a second output terminal 414.

One of the two first resistors R1 is connected in parallel between the first input terminal 411 and the first output terminal 413 of the first stage of amplifier 410, and the other of the two first resistors R1 is connected in parallel between the second input terminal 412 and the second output terminal 414 of the first stage of amplifier 410.

In another embodiment, as shown in FIG. 3, the signal amplifying circuit 40 further includes a second stage of amplifier 420 and two second resistors R2.

The second stage of amplifier 420 includes a first input terminal 421 which is connected to the first output terminal 413 of the first stage of amplifier 410 at a first joint A, a second input terminal 422 which is connected to the second output terminal 414 of the first stage of amplifier 410 at a second joint B, a first output terminal 423 and a second output terminal 424, wherein the one of the two first resistors R1 is connected in parallel between the first input terminal 411 of the first stage of amplifier 410 and the first output terminal 423 of the second stage of amplifier 420, and the other of the two first resistors R1 is connected in parallel between the second input terminal 412 of the first stage of amplifier 410 and the second output terminal 424 of the second stage of amplifier 412; one of the two second resistors R2 is connected in parallel between the first joint A and the first output terminal 423 of the second stage of amplifier 420, and the other of the two second resistors R2 is connected in parallel between the second joint B and the second output terminal 424 of the second stage of amplifier 420.

In the embodiment, the circuit structure formed by the first stage of amplifier 410, the second stage of amplifier 420, the first resistors R1 and the second resistors R2 may be referred to as a nested transimpedance amplifier. Given the transconductance gm1 of the first stage of amplifier 410, the open-loop gain A of the nested transimpedance amplifier may be calculated from the transconductance gm1 as $A=gm1*R_2$, and thus increasing the transconductance gm1 of the first stage of amplifier 410 can effectively reduce the noise figure, where $R_2$ represents the resistance of the second resistor R2.

Given the resistance $R_1$ of the first resistor R1, the input impedance Zin of the nested transimpedance amplifier may be calculated as $Zin=R_1/(gm1*R_2)$. In order to ensure source impedance matching, achieve relatively accurate source impedance matching, and reduce the return loss, the input impedance is fixed. In this case, the resistance $R_2$ is decreased if the transconductance gm1 is increased.

Here, because the ratio $R_1/R_2$ of the resistance $R_1$ to the resistance $R_2$ is fixed and the input return loss (i.e. the input reflection coefficient S11) is proportional to the ratio $R_1/R_2$, changes in the on-chip resistance $R_1$ and $R_2$ will not affect the source impedance matching. If the input reflection coefficient S11 is decreased, the input impedance matching becomes better and the signal transmission loss is reduced. Further, if the gain of the second stage of amplifier 420 is increased, the linearity of the signal mixing circuit device is improved, and not only the source impedance matching is satisfied, the noise figure is effectively reduced, and the gain is increased, but also the area and power consumption of the circuit is reduced.

In an embodiment, as shown in FIG. 4, the first mixer 10 includes a first transistor switch 111 and a second transistor switch 112.

The first transistor switch 111 includes a gate configured for receiving the first LO signal, a drain configured for outputting the first mixed signal, and a source.

The second transistor switch 112 includes a gate configured for receiving the second LO signal, a drain configured for outputting the second mixed signal, and a source.

The sources of the first transistor switch and the second transistor switch are configured for receiving the RF signal.

In an embodiment, the first transistor switch 111 and the second transistor switch 112 may be P-channel Metal Oxide Semiconductor (PMOS) transistors or N-channel Metal Oxide Semiconductor (NMOS) transistors. The source of the first transistor switch 111 and the source of the second transistor switch 112 are connected to form the RF signal input terminal 110. The grid of the first transistor switch 111 serves as the first LO signal input terminal 121, and the grid of the second transistor switch 112 serves as the second LO signal input terminal 122. The drain of the first transistor switch 111 serves as the first mixed-signal output terminal 130, and the drain of the second transistor switch 112 serves as the second mixed-signal output terminal 140.

The first transistor switch 111 and the second transistor switch 112 are configured to sample and down-convert the RF signal into an intermediate frequency signal. Specifically, the RF signal can be down-converted to a differential intermediate frequency signal by using a differential sampling clock. The purpose of the down conversion is to decrease the carrier frequency of the RF signal or simply remove the carrier frequency to obtain a baseband signal. The first mixed signal IFp and the second mixed signal IFn may be differential intermediate frequency signals.

In an embodiment, as shown in FIG. 5, the second mixer 20 includes a third transistor switch 113 and a fourth transistor switch 114.

The third transistor switch 113 includes a gate configured for receiving the second LO signal, a source configured for receiving the first mixed signal, and a drain; and the source of the third transistor switch 113 is connected to the drain of the first transistor switch 111.

The fourth transistor switch 114 includes a gate configured for receiving the first LO signal, a source configured for receiving the second mixed signal, and a drain; and the source of the fourth transistor switch 114 is connected to the drain of the second transistor switch 112.

The drains of the third transistor switch 113 and the fourth transistor switch 114 are connected to the capacitor 30.

In an embodiment, the third transistor switch 113 and the fourth transistor switch 114 may be P-channel Metal Oxide Semiconductor (PMOS) transistors or N-channel Metal Oxide Semiconductor (NMOS) transistors. The grid of the third transistor switch 113 serves as the first LO signal input terminal 231 of the second mixer 20 and is configured to receive the second LO signal. The grid of the fourth transistor switch 114 serves as the second LO signal input terminal 232 of the second mixer 20 and is configured to receive the first LO signal. The drains of the third transistor switch 113 and the fourth transistor switch 114 are both connected to the capacitor 30.

As can be seen from the above-described connections between the first mixer 10 and the second mixer 20, cancellation of noise of the mixed signals occurs between the first mixer 10 and second mixer 20, so that the port noise at the LO signal input terminals of the first mixer 10 can be effectively eliminated.

In an embodiment, the first LO signal has a phase of 0°, and the second LO signal has a phase of 180°. Alternatively, the first LO signal has a phase of 90°, and the second LO signal has a phase of 270°.

In an example, the first LO signal LOp may have a phase of 0° and the second LO signal LOn may have a phase of 180°, or, the first LO signal LOp may have a phase of 90° and the second LO signal LOn may have a phase of 270°, so that the phase of the first LO signal Lop is different from the phase of the second LO signal Lon by 180°. Of course, the phases of the first LO signal LOp and the second LO signal LOn and the preset phase difference therebetween may be adjusted adaptively as desired, without departing from the scope of the embodiment.

In an embodiment, the first stage of amplifier 410 and/or the second stage of amplifier 420 may be embodied by a single-stage CMOS circuit element. Hereinafter, two types of the single-stage CMOS circuit elements are illustratively described as examples.

As shown in FIG. 6, a single-stage CMOS circuit element includes a first transistor 101, a second transistor 102, a third transistor 103, and a fourth transistor 104. The gates of the first transistor 101 and the third transistor 103 are connected as the first input terminal 411, the gates of the second transistor 102 and the fourth transistor 104 are connected as the second input terminal 412, the drains of the first transistor 101 and the third transistor 103 are connected as the second output terminal 414, and the drains of the second transistor 102 and the fourth transistor 104 are connected as the first output terminal 413.

In an example, two of the first, second, third and fourth transistor 101 to 104 are connected in series to form a first branch, and the other two of the first, second, third and fourth transistor 101 to 104 are connected in series to form a second branch. The first branch and the second branch are connected in parallel to form a parallel circuit, and one end of the parallel circuit is connected to a supply voltage $V_{DD}$ via a constant current source, while the other end of the parallel circuit is connected to a ground voltage Vss via another constant current source. Specifically, the first transistor 101 and the second transistor 102 may be PMOS transistors, and the third transistor 103 and the fourth transistor 104 may be NMOS transistors. The source of the first transistor 101 and the source of the second transistor 102 are connected to each other and both connected to the supply voltage $V_{DD}$ via the constant current source. The source of the third transistor 103 and the source of the fourth transistor 104 are connected to each other and both connected to the ground voltage Vss via the another constant current source.

It should be noted that, in the case where the first stage of amplifier 410 is embodied by the single-stage CMOS circuit unit provided in the present embodiment, the gates of the first transistor 101 and the third transistor 103 are connected as the first input terminal 411 for receiving the first mixed signal IFp (INp), the gates of the second transistor 102 and the fourth transistor 104 are connected as the second input terminal 412 for receiving the second mixed signal IFn (INn), the drains of the first transistor 101 and the third transistor 103 are connected as the second output terminal 414 for outputting a second amplified signal (OUTn), and the drains of the second transistor 102 and the fourth transistor 104 are connected as the first output terminal 413 for outputting a first amplified signal (OUTp).

In the case where the second stage of amplifier 420 is embodied by the single-stage CMOS circuit unit provided in the present embodiment, the gates of the first transistor 101 and the third transistor 103 are connected as the first input terminal 421 for receiving the first amplified signal (INp), the gates of the second transistor 102 and the fourth transistor 104 are connected as the second input terminal 422 for receiving the second amplified signal (INn), the drains of the first transistor 101 and the third transistor 103 are connected as the second output terminal 424 for outputting the fourth amplified signal (OUTn), and the drains of the second transistor 102 and the fourth transistor 104 are connected as the first output terminal 423 for outputting the third amplified signal (OUTp).

FIG. 7 shows another single-stage CMOS circuit unit which includes a first transistor 101', a second transistor 102', a third transistor 103', a fourth transistor 104', a fifth transistor 105', a sixth transistor 106', a seventh transistor 107' and an eighth transistor 108'. The first transistor 101', the third transistor 103', the fifth transistor 105' and the seventh transistor 107' are connected in series to form a first branch, while the second transistor 102', the fourth transistor 104', the sixth transistor 106' and the eighth transistor 108' are connected in series to form a second branch. The first branch and the second branch are connected in parallel to form a parallel circuit, and one end of the parallel circuit is connected to a supply voltage $V_{DD}$ via a constant current source, while the other end of the parallel circuit is connected to a ground voltage Vss via another constant current source. Specifically, the first transistor 101', the second transistor 102', the third transistor 103', and the fourth transistor 104' may be PMOS transistors. The fifth transistor 105', the sixth transistor 106', the seventh transistor 107', and the eighth transistor 108' may be NMOS transistors. The source of the first transistor 101' and the source of the second transistor 102' are connected to each other and both connected to the supply voltage $V_{DD}$ via the constant current source, and the source of the seventh transistor 107' and the source of the eighth transistor 108' are connected to each other and both connected to the ground voltage $V_{SS}$ via the another constant current source.

The gates of the first transistor 101' and the seventh transistor 107' are connected as the first input terminal 411, the gates of the second transistor 102' and the eighth transistor 108' are connected as the second input terminal 412, the drains of the third transistor 103' and the fifth transistor 105' are connected as the second output terminal 414, and the drains of the fourth transistor 104' and the sixth transistor 106' are connected as the first output terminal 413. The gates of the third transistor 103' and the fourth transistor 104' may be both connected to a constant voltage, and the gates of the fifth transistor 105' and the sixth transistor 106' may be both connected to another constant voltage.

It should be noted that, in the case where the first stage of amplifier 410 includes the another single-stage CMOS circuit unit provided in the embodiment, the gates of the first transistor 101' and the seventh transistor 107' are connected as the first input terminal 411 for receiving the first mixed signal IFp (INp), the gates of the second transistor 102' and the eighth transistor 108' are connected as the second input terminal 412 for receiving the second mixed signal IFn (INn), the drains of the third transistor 103' and the fifth transistor 105' are connected as the second output terminal 414 for outputting the second amplified signal (OUTn), and the drains of the fourth transistor 104' and the sixth transistor 106' are connected as the first output terminal 413 for outputting the first amplified signal (OUTp).

In the case where the second stage of amplifier 420 includes the another single-stage CMOS circuit unit provided in the embodiment, the gates of the first transistor 101' and the seventh transistor 107' are connected as the first input terminal 421 for receiving the first amplified signal (INp), the gates of the second transistor 102' and the eighth transistor 108' are connected as the second input terminal 422 for receiving the second amplified signal (INn), the drains of the third transistor 103' and the fifth transistor 105' are connected as the second output terminal 424 for outputting the fourth amplified signal (OUTn), and the drains of the fourth transistor 104' and the sixth transistor 106' are connected as the first output terminal 423 for outputting the third amplified signal (OUTp).

In this embodiment, the provided single-stage CMOS circuit units have a small area and low power consumption, and furthermore can provide a sufficient current signal or voltage signal for noise reduction.

In an embodiment, the first stage of amplifier 410 and/or the second stage of amplifier 420 include a multi-stage CMOS circuit unit, which includes an input subunit, a gain subunit and an output subunit that are sequentially connected in series.

For example, as shown in FIG. 8, the multi-stage CMOS circuit unit may include an input subunit, a gain subunit, and an output subunit which are sequentially connected in series, and a phase compensation capacitor is connected in parallel with the gain subunit. In the case where the first stage of amplifier 410 is embodied by the multi-stage CMOS circuit unit, the input subunit includes the first input terminal 411 and the second input terminal 412, where the first input terminal 411 is used to receive the first mixed signal, while the second input terminal 412 is used to receive the second mixed signal, and the output subunit includes the first output terminal 413 and the second output terminal 414, which are used to output the signals differentially amplified by the first stage of amplifier 410. Of course, the first stage of amplifier 410 may alternatively embodied by the single-stage CMOS circuit unit, to likewise output the differentially amplified signals. In the case where the second stage of amplifier 420 is embodied by the multi-stage CMOS circuit unit, the input subunit includes the first input terminal 421 and the second input terminal 422 which are configured for receiving the differentially amplified signals output from the first stage of amplifier 410, and the output subunit includes the first output terminal 423 and the second output terminal 424 which are configured for outputting the signals differentially amplified by the second stage of amplifier 420.

In this embodiment, the multi-stage CMOS circuit unit can improve the open-loop gain, thereby improving the linearity.

In an embodiment, as shown in FIG. 9, a two-stage CMOS circuit unit is illustratively described for the sake of further describing the multi-stage CMOS circuit unit.

As shown in FIG. 9, the input subunit includes a first transistor 101" and a second transistor 102", where the gate of the first transistor 101" serves as the first input terminal 411, the gate of the second transistor 102" serves as the second input terminal 412, the source of the first transistor 101" and the source of the second transistor 102" are connected to the supply voltage $V_{DD}$, and the drain of the first transistor 101" and the drain of the second transistor 102" are connected to the ground voltage Vss.

The gain subunit includes a third transistor 103", a fourth transistor 104", a fifth transistor 105" and a sixth transistor 106", where the gates of the third transistor 103" and the fourth transistor 104" are both connected to a first voltage, the sources of the third transistor 103" and the fourth transistor 104" are connected to the supply voltage $V_{DD}$, and the drains of the third transistor 103" and the fourth transistor 104" are both connected to the ground voltage Vss.

The gates of the fifth transistor 105" and the sixth transistor 106" are both connected to a second voltage, the sources of the fifth transistor 105" and the sixth transistor 106" are both connected to the supply voltage $V_{DD}$, and the drains of the fifth transistor 105" and the sixth transistor 106" are both connected to the ground voltage Vss.

The output subunit includes a seventh transistor 107", an eighth transistor 108", a ninth transistor 109" and a tenth transistor 100", where the gate of the seventh transistor 107" and the sources of the third transistor 103" and the fourth transistor 104" are connected at a third joint C, the source of the seventh transistor 107" is connected to the supply voltage $V_{DD}$, the drains of the seventh transistor 107" and the eighth transistor 108" are connected as the first output terminal 413, and the gate and the source of the eighth transistor 108" are connected to the ground voltage $V_{SS}$.

The gate of the ninth transistor 109" and the sources of the fifth transistor 105" and the sixth transistor 106" are connected at a fourth joint D, the source of the ninth transistor 109" is connected to supply voltage $V_{DD}$, the drains of the ninth transistor 109" and the tenth transistor 100" are connected as the second output terminal 414, and the gate and source of the tenth transistor 100" are connected to the ground voltage $V_{SS}$.

In an example, the first transistor 101", the second transistor 102", the third transistor 103", the sixth transistor 106", the seventh transistor 107", and the ninth transistor 109" may be PMOS transistors, while the fourth transistor 104", the fifth transistor 105", the eighth transistor 108", and the tenth transistor 100" may be NMOS transistors. The sources of the first transistor 101" and the second transistor 102" are connected to each other and both connected to the supply voltage $V_{DD}$ via a constant current source, the drain of the first transistor 101" and the drain of the second transistor 102" are connected to the ground voltage Vss via two constant current sources, respectively. The gate of the seventh transistor 107" and the sources of the third transistor 103" and the fourth transistor 104" are connected at the third joint C and further connected to the supply voltage $V_{DD}$ via a constant current source. The source of the seventh transistor 107" may be directly connected to the supply voltage $V_{DD}$. The gate of the eighth transistor 108" and the drains of the third transistor 103" and the fourth transistor 104" are connected to each other and further connected to the ground voltage $V_{SS}$ via a constant current source, and the drain of the eighth transistor 108" may be directly connected to the ground voltage $V_{SS}$. Similarly, the gate of the ninth transistor 109" and the sources of the fifth transistor 105" and the sixth transistor 106" are connected at the fourth joint and further connected to the supply voltage $V_{DD}$ via a constant current source. The source of the ninth transistor 109" may be directly connected to the supply voltage $V_{DD}$. The gate of the tenth transistor 100" and the drains of the fifth transistor 105" and the sixth transistor 106" are connected to each other and further connected to the ground voltage $V_{SS}$ via a constant current source, and the drain of the tenth transistor 100" may be directly connected to the ground voltage $V_{SS}$.

It should be noted that, in the case where the first stage of amplifier 410 is embodied by the two-stage CMOS circuit unit provided in this embodiment, the gate of the first transistor 101" serves as the first input terminal 411 for receiving the first mixed signal IFp (INp), the gate of the second transistor 102" serves as the second input terminal 412 for receiving the second mixed signal IFn (INn), the drains of the seventh transistor 107" and the eighth transistor 108" are connected as the first output terminal 413 for outputting the first amplified signal (OUTp), and the drains of the ninth transistor 109" and the tenth transistor 100" are connected as the second output terminal 414 for outputting the second amplified signal (OUTn).

In the case where the second stage of amplifier 420 is embodied by the two-stage CMOS circuit unit provided in this embodiment, the gate of the first transistor 101" serves as the first input terminal 421 for receiving the first amplified signal (INp), the gate of the second transistor 102" serves as the second input terminal 422 for receiving the second amplified signal (INn), the drains of the seventh transistor 107" and the eighth transistor 108" are connected as the first output terminal 423 for outputting the third amplified signal (OUTp), and the drains of the ninth transistor 109" and the tenth transistor 100" are connected as the second output terminal 424 for outputting the fourth amplified signal (OUTn).

Of course, the multi-stage CMOS circuit unit can be modified as actually desired, without departing from the protection scope of the present invention.

Figure 10:
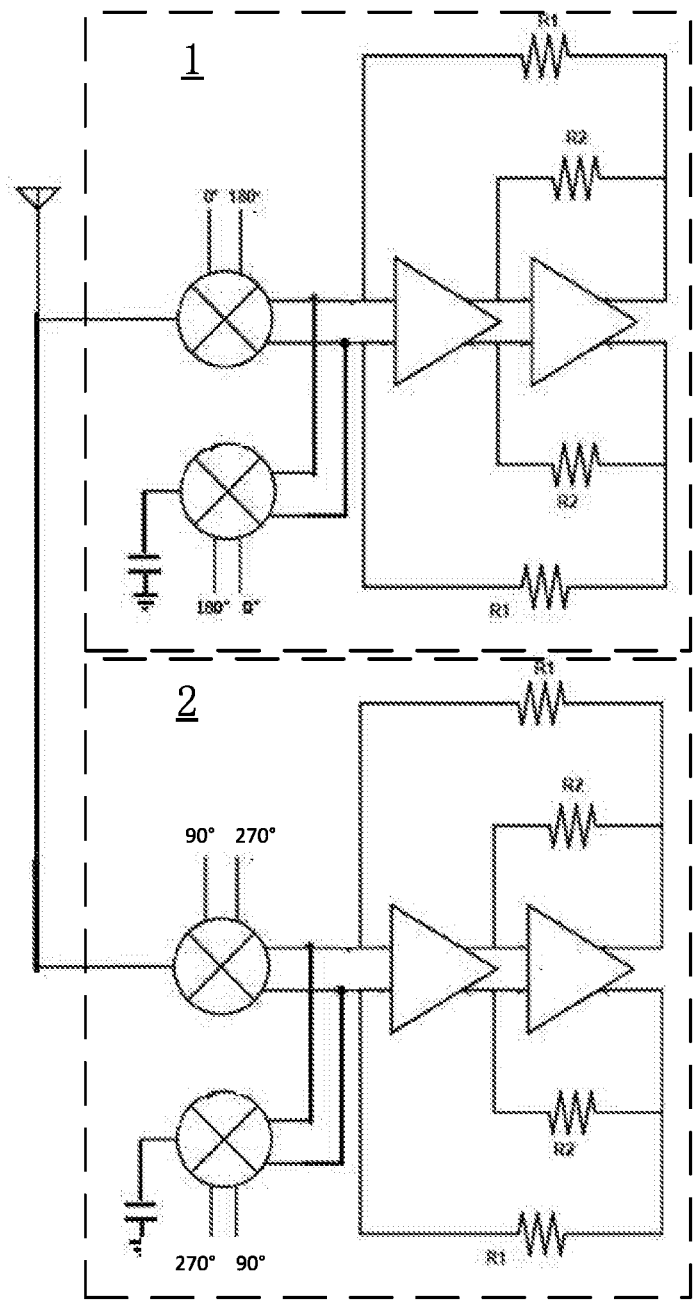
FIG. 10 is a schematic structural diagram of a signal mixing circuit device according to still another embodiment of the present invention.

As shown in FIG. 10, an embodiment provides a receiver which includes at least one signal mixing circuit device provided in the above embodiments. For example, the receiver may include a signal mixing circuit device 1 and a signal mixing circuit device 2. Of course, the number of the signal mixing circuit devices in the receiver may be varied depending on actual needs, without departing from the protection scope of the present invention.

Figure 11:
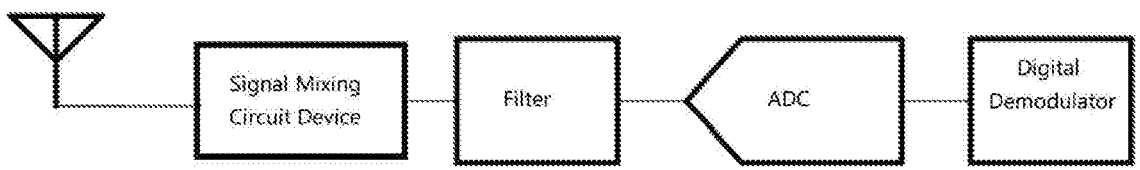
FIG. 11 is a schematic diagram of a receiver according to an embodiment of the present invention.

As shown in FIG. 11, the signal mixing circuit device is followed by a filter, an Analog-to-Digital Converter and a digital demodulator which are sequentially connected. Specifically, the filter may be an analog baseband filter, for example. Because the signal mixing circuit device provided in the above embodiments takes place of the band-pass or low-pass filter, MN, LNA and the mixer in the existing receiver, the size of the receiver is significantly reduced, power consumption is decreased, and the efficiency of signal amplification is improved.

The above description illustrates merely some specific implementation of the present disclosure, but is not intended to limit the scope of protection of the present invention, and any variation or replacement readily occurring to those skilled in the art within the technical scope disclosed by the present invention should be covered by the protection scope of the present invention. Therefore, the protection scope of the present invention should be subject to the protection scope of the claims.

What is claimed is:

1. A signal mixing circuit device, comprising:
a first mixer;
a second mixer; and
a signal amplifying circuit connected in serial with the first mixer,
wherein the first mixer includes an RF signal input terminal configured to receive an RF signal, LO signal input terminals configured to sample a first LO signal and a second LO signal, a first mixed-signal output terminal configured to output a first mixed signal, and a second mixed-signal output terminal configured to output a second mixed signal, and the first and second mixed-signal output terminals of the first mixer are connected to the signal amplifying circuit, and
wherein the second mixer includes an input terminal connected to a capacitor, a first mixed-signal output terminal which is connected to the first mixed-signal output terminal of the first mixer, a second mixed-signal output terminal which is connected to the second mixed-signal output terminal of the first mixer, and LO signal input terminals configured to inversely sample the first LO signal and the second LO signal.

2. The circuit device of claim 1, wherein the signal amplifying circuit includes a first stage of amplifier and two first resistors, wherein the first stage of amplifier includes a first input terminal which is connected to the first mixed-signal output terminal of the first mixer and configured to receive the first mixed signal, a second input terminal which is connected to the second mixed-signal output terminal of the first mixer and configured to receive the second mixed signal, a first output terminal and a second output terminal, and wherein one of the two first resistors is connected in parallel between the first input terminal and the first output terminal of the first stage of amplifier, and the other of the two first resistors is connected in parallel between the second input terminal and the second output terminal of the first stage of amplifier.

3. The circuit device of claim 2, wherein the signal amplifying circuit further includes a second stage of amplifier and two second resistors and wherein the second stage of amplifier includes a first input terminal which is connected to the first output terminal of the first stage of amplifier at a first joint, a second input terminal which is connected to the second output terminal of the first stage of amplifier at a second joint, a first output terminal and a second output terminal, wherein the one of the two first resistors is connected in parallel between the first input terminal of the first stage of amplifier and the first output terminal of the second stage of amplifier, and the other of the two first resistors is connected in parallel between the second input terminal of the first stage of amplifier and the second output terminal of the second stage of amplifier; one of the two second resistors is connected in parallel between the first joint and the first output terminal of the second stage of amplifier, and the other of the two second resistors is connected in parallel between the second joint and the second output terminal of the second stage of amplifier.

4. The circuit device of claim 1, wherein the first mixer includes a first transistor switch and a second transistor switch; wherein the first transistor switch includes a gate configured for receiving the first LO signal, a drain configured for outputting the first mixed signal, and a source; wherein the second transistor switch includes a gate configured for receiving the second LO signal, a drain configured for outputting the second mixed signal, and a source; and the sources of the first transistor switch and the second transistor switch are configured for receiving the RF signal.

5. The circuit device of claim 4, wherein the second mixer includes a third transistor switch and a fourth transistor switch, wherein the third transistor switch includes a gate configured for receiving the second LO signal, a source configured for receiving the first mixed signal, and a drain; and the source of the third transistor switch is connected to the drain of the first transistor switch, wherein the fourth transistor switch includes a gate configured for receiving the first LO signal, a source configured for receiving the second mixed signal, and a drain; and the source of the fourth transistor switch is connected to the drain of the second transistor switch, and wherein the drains of the third transistor switch and the fourth transistor switch are grounded.

6. The circuit device of claim 1, wherein the first LO signal has a phase of 0°, and the second LO signal has a phase of 180°; or the first LO signal has a phase of 90°, and the second LO signal has a phase of 270°, so that the phase of the first LO signal is different from that of the second LO signal by 180°.

7. The circuit device of claim 2, wherein the first stage of amplifier and/or the second stage of amplifier include a single-stage Complementary Metal Oxide Semiconductor circuit unit.

8. The circuit device of claim 3, wherein the first stage of amplifier and/or the second stage of amplifier include a single-stage Complementary Metal Oxide Semiconductor circuit unit.

9. The circuit device of claim 2, wherein the first stage of amplifier and/or the second stage of amplifier include a multi-stage Complementary Metal Oxide Semiconductor circuit unit.

10. The circuit device of claim 3, wherein the first stage of amplifier and/or the second stage of amplifier include a multi-stage Complementary Metal Oxide Semiconductor circuit unit.

11. A receiver, comprising:
    at least one signal mixing circuit device of claim 1.

* * * * *